United States Patent

Chi

[19]

[11] Patent Number: 6,064,053
[45] Date of Patent: May 16, 2000

[54] OPERATION METHODS FOR ACTIVE BICMOS PIXEL FOR ELECTRONIC SHUTTER AND IMAGE-LAG ELIMINATION

[75] Inventor: Min-Hwa Chi, Hsinchu, Taiwan

[73] Assignee: Vanguard International Semiconductor Corporation, Hsin-Chu, Taiwan

[21] Appl. No.: 09/053,854

[22] Filed: Apr. 2, 1998

[51] Int. Cl.[7] .................................................. H01L 27/00
[52] U.S. Cl. ........................ 250/208.1; 257/223; 257/290; 257/291
[58] Field of Search ............................... 250/208.1, 214.1; 257/290, 291, 292, 293, 225, 223

[56] References Cited

U.S. PATENT DOCUMENTS

| | | | |
|---|---|---|---|
| 5,097,305 | 3/1992 | Mead et al. | 35/30 |
| 5,260,592 | 11/1993 | Mead et al. | 257/291 |
| 5,512,950 | 4/1996 | Watanabe et al. | 348/297 |
| 5,576,763 | 11/1996 | Ackland et al. | 348/308 |
| 5,587,596 | 12/1996 | Chi et al. | 257/223 |
| 5,608,243 | 3/1997 | Chi et al. | 257/249 |
| 5,619,049 | 4/1997 | Rim | 257/223 |
| 5,710,446 | 1/1998 | Chi et al. | 257/225 |

OTHER PUBLICATIONS

"A High Resolution CMOS Images With Active Pixel Using Capacitively Coupled Bipolar Operation", Chi et al, paper #82, Proceedings of International Conference on VSLI technology, Systems and applications, Taipei, Taiwan, Jun. 1997.
"Image Capture Circuits in CMOS", E. Fossum. paper #B1, Proceedings of International Conference on VSLI–Technology, System and Applications, Taipei, Taiwan, Jun. 1997.

*Primary Examiner*—Que T. Le
*Assistant Examiner*—Thanh X. Luu
*Attorney, Agent, or Firm*—George O. Saile; Stephen B. Ackerman; Billy Knowles

[57] ABSTRACT

Methods of operation of an active pixel sensor cell to provide electronic shuttering and elimination of image lag are disclosed. An active pixel sensor has a photodiode, a bipolar transistor, a pass MOS transistor, and a parasitic MOS transistor. The first method of operation of the active pixel sensor will vary the time the integration time of the active pixel sensor by adjusting the time of a resetting pulse to the anode of the photodiode to eliminate any accumulated charge relative to the integration time. The second method will place the anode of the photodiode in a sleep mode by resetting the anode of the photodiode for a period of time. The relative time of the sleep mode to the integration time will determine the electronic shuttering. The third method to eliminate the image-lag overlaps the read period and the sleep time, and brings the reset biasing voltage source to a lower level to extract all the minority carriers from the base of the bipolar transistor.

8 Claims, 12 Drawing Sheets

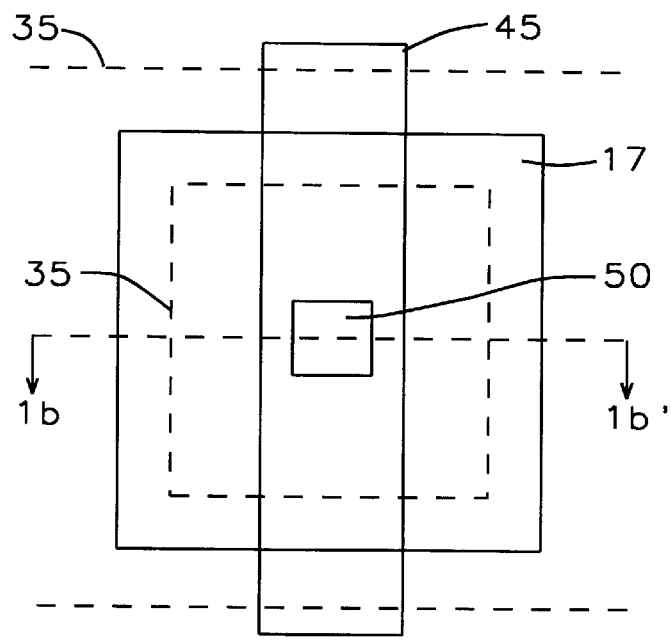
FIG. 1a – Prior Art
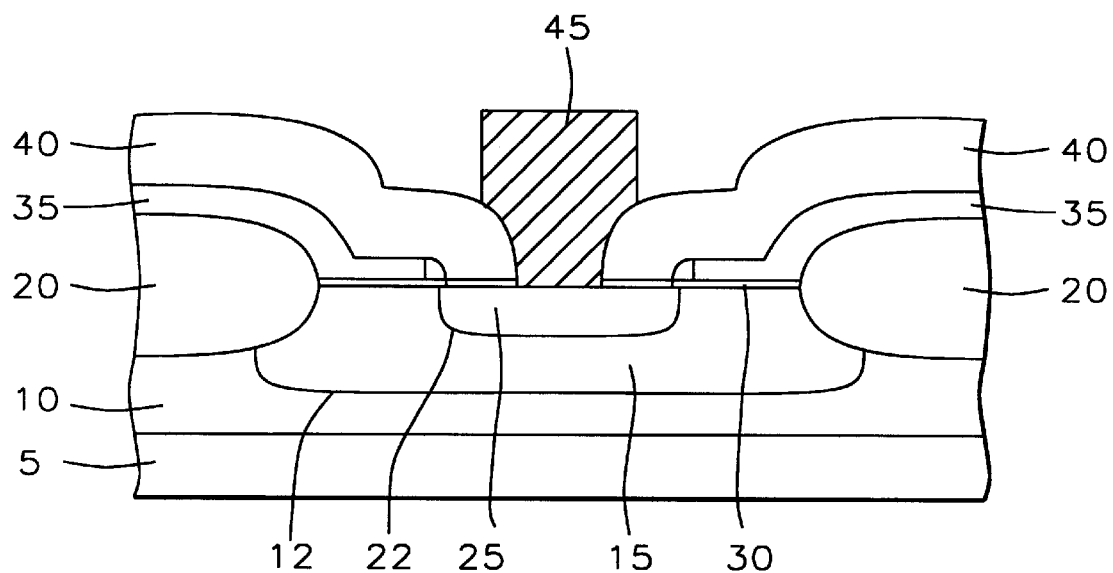
FIG. 1b – Prior Art

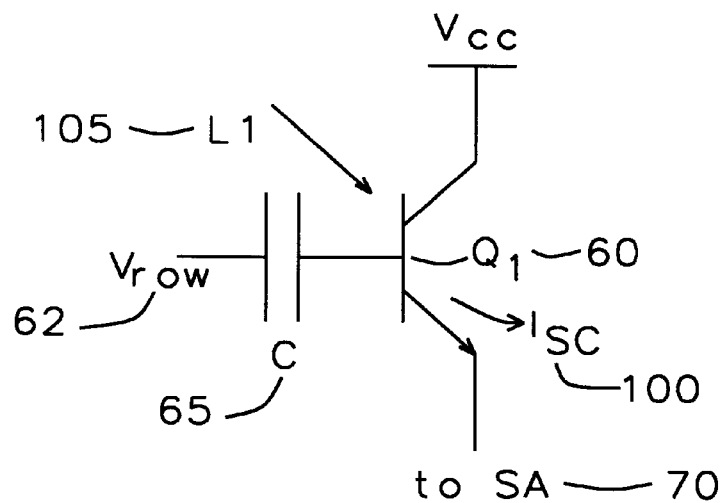
FIG. 1c – Prior Art
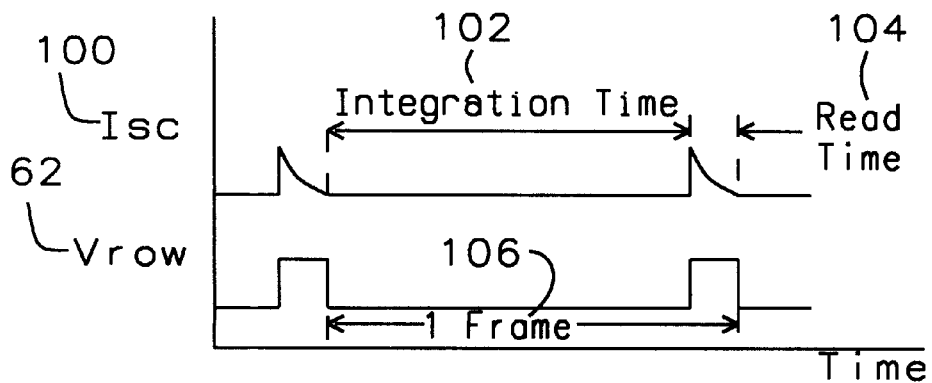
FIG. 1d – Prior Art

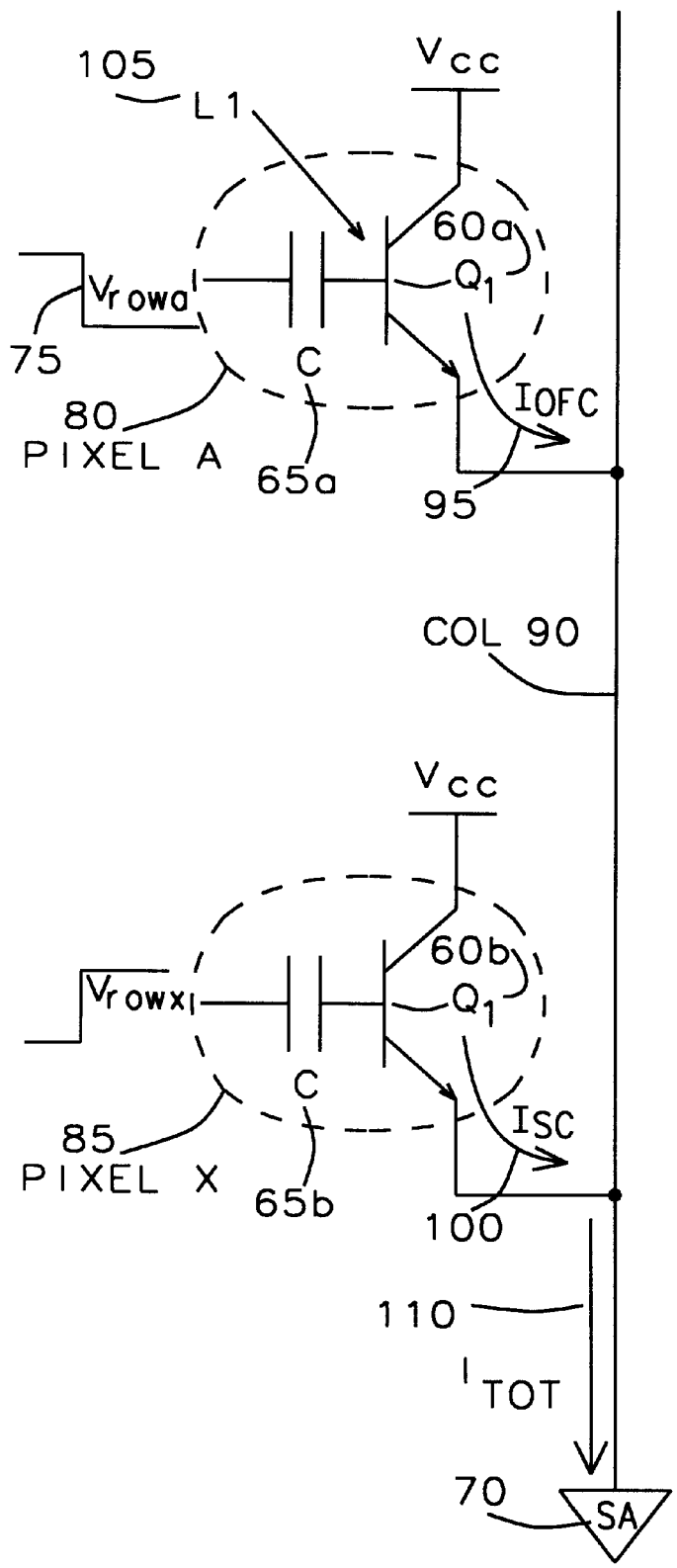
FIG. 2 - Prior Art

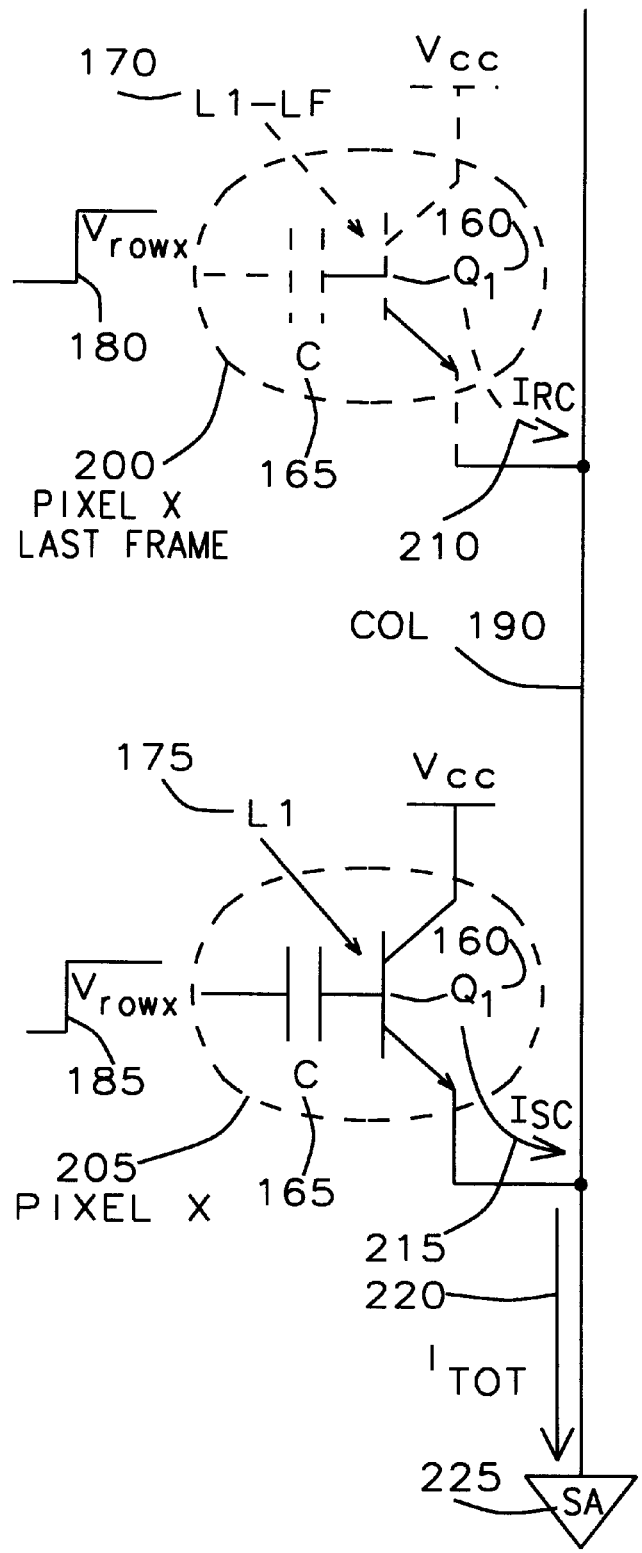
FIG. 3 – Prior Art

OPERATION METHODS FOR ACTIVE BICMOS PIXEL FOR ELECTRONIC SHUTTER AND IMAGE-LAG ELIMINATION

BACKGROUND OF THE INVENTION

1. Field of the Invention

This invention relates to circuits and semiconductor devices that will receive light and convert the light to an electronic signal representing the amplitude of the light commonly referred to as photosensors or pixel sensors. More particularly this invention relates to the methods of operation photosensors or pixel sensors to provide electronic shuttering and to eliminate image-lag.

2. Description of Related Art

Imaging circuits typically include a two dimensional array of photosensors. Each photosensor will comprise one picture element (pixel) of the image. Light energy emitted or reflected from an object will impinge upon the array of photosensors. The light energy will be converted by the photosensors to an electrical signal. Imaging circuitry will scan the individual photosensors to readout the electrical signals. The electrical signals of the image will be processed by external circuitry for subsequent display.

The most common single chip imaging technology in use is the charge coupled device (CCD) camera. A CCD operates by accumulating charge generated within a photo sensor in potential wells in the semiconductor substrate. The depth of the potential wells is controlled by the voltage on a gate electrode located just above the surface of the semiconductor substrate. By manipulating the voltage on the gate electrodes, the charges can be moved along the surface of the semiconductor substrate to a sensing point. The charges will be amplified into the electronic signals of the image.

Modern metal oxide semiconductor (MOS) processing techniques have allowed the transport of charges within CCD structures to be accomplished with almost perfect efficiency at video rates. However, some fraction of the charge accumulated will be lost during the shifting of the charge along the surface. The charge accumulated within each potential well will be shifted and sensed once per frame time. Typically this time is on the order of 30–60 frames per second.

The CCD technology has limitations. The charge generated by the impinging light is shifted directly before being sensed and amplified. Because of the inefficiency of this process, the gain of the device (electrons out vs. photons in) is less than unity. The will impose limitations on the amount of charge to be stored in each well. The amount of minimum charge will be the amount that can be sensed in the sense amplifier above the noise of the sense amplifier. The amount of maximum charge will be limited by the amount that will physically be able to be generated and shifted from one well to the next.

To overcome these dynamic-range limitations of the CCD, a phototransistor has been used to sense the incoming light. High resolution imagers as described in U.S. Pat. No. 5,260,592 (Mead et al.), U.S. Pat. No. 5,324,958 (Mead et al.), and "A High Resolution CMOS Imager With Active Pixel Using Capacitively Coupled BiPolar Operation", Chi et al, paper #82, Proceedings of International Conference on VLSI-technology systems, and applications, Taipei, Taiwan, June 1997, have a simple structure as shown in FIGS. 1a, 1b, and 1c. These pixel structures employ standard processing techniques typical to CMOS logic technology.

An N-type impurity is implanted in a P-substrate 5 to form an N-well 10. A field oxide 20 is grown on the surface of the semiconductor substrate to define the boundaries of the pixel cell. Within the field oxide 20 a p-type impurity is implanted to form the P-base 15 of the phototransistor Q1 60. The N-well 10 will be connected to a power supply voltage source and act as the collector of the phototransistor Q1 60. Next a thin layer of gate oxide is grown on the surface of the P-base 15 to form the capacitor dielectric 30 of the capacitor C 65. A layer of polysilicon material 35 will be deposited over the P-base 15 to form the second plate of the capacitor C 65. After a short re-oxidation and formation of oxide spacer an n-type impurity is implanted to form the emitter 25 of the phototransistor Q1 60. The P-base 15 is left floating. Its potential is determined by the $V_{row}$ through the coupling of capacitor C 65. The layer of polysilicon material will also be connected to the row activation voltage circuit $V_{row}$ 62. The row activation circuit $V_{row}$ 62 will activate the phototransistor Q1 60 to transfer charges collected by the phototransistor Q1 60.

A second insulating material such as silicon dioxide is deposited on the surface of the semiconductor substrate to form the dielectric 40. A metal layer 45 is place in contact 50 with the emitter 25 of the bipolar transistor Q1 60. The metal layer 45 will provide the interconnection to the sense amplifier 70. It is apparent that the above described process flow can be used to form CMOS transistors. For instance the polysilicon material 35 can be used to form a gate of the CMOS transistor and the n-type implant that is used to form the emitter 25 can be used to form a source/drain region. The compatibility of fabricating bipolar pixels and CMOS transistors is a great advantage compared to the process used in CCD fabrication methods.

A quantum of light energy L1 105 will be reflected or emitted from an external object and impinge upon the P-base active region 17. The photons of the quantum of light energy 105 will be absorbed in the neighborhood of the collector-base junction 12 and the emitter base junction 22 and form electron-hole pairs. The nearest p-n junction will collect the electron-hole pairs. The minority carriers collected by either the collector-base junction 12 or the emitter-base junction 22 will as base current. The base current is multiplied by the current gain of the transistor to form the collector current. The signal current $I_{sc}$ 100 at the emitter 25 of the transistor Q1 60 is the sum of the base current created by the conversion of the quantum of light 105 to the electron-hole pairs and the collector current. The signal current $I_{sc}$ 100 will be transferred to the sense amplifier 70 for further conditioning.

Refer now additionally to FIG. 1d to understand the operation of the photo transistor pixel structure. During the integration period 102 the row activation circuit $V_{row}$ 62 is held at a fixed voltage to reverse bias the base-emitter junction 22 of the transistor Q1 60. Under this condition, the current created by the conversion of the quantum of light 105 to the electron-hole pairs will integrate on the capacitor C 65.

When it is desired to read the amount of charge created during the integration period 107, the row activation circuit $V_{row}$ 62 is brought to a high voltage level during the read time 104. The P-base potential is raised by Vrow 62 through capacitor C 65 coupling and becomes forward biased with respect to the emitter 25. The charge on capacitor C 65 will flow in the base 15 of the transistor Q1 60 and form the emitter current, which is the signal current $I_s$ 100.

Other structures incorporating photodiodes and MOS transistors are described in "Image Capture Circuits in CMOS" E. Fossum, Paper #B1, Proceedings of International Conference on VLSI-Technology, Systems, and Applications, Taipei, Taiwan, June 1997. A passive pixel circuit consists of a photodiode and a MOS pass transistors. The photodiode will convert light to electric charge. The MOS pass transistor will gate the electric charge to a charge integrating amplifier. An active pixel circuit will have a photodiode, a MOS pass transistor, and a source follower to act as a buffer amplifier to the charge integrating amplifier. A MOS transistor activated by a reset signal is added to the active pixel circuit to reset the photodiode to act as an electronic shutter. The time of the electronic shutter will be modified by adjusting the activation time of the MOS transistor activated by the reset signal. The varying of the reset time within a fixed frame time will adjust the exposure time of the photodiode to adjust the amount of time the photodiode will collect the electrons generated by the image photons.

The active bipolar pixel of FIGS. 1a, 1b, and 1c have the advantage of high sensitivity, simpler pixel layout, and lower manufacturing cost compared to CMOS pixels as described in Chi. However, the bipolar active pixels have the limitations of blooming and image lag. Further, the active bipolar pixels of FIGS. 1a, 1b, and 1c can not implement an electronic shutter without modifying the frame rate of the active bipolar pixel sensor.

Refer now to FIG. 2 to understand the phenomena of blooming. In an array of pixels (pixel A 80–pixel X 85), one row of pixels—pixel A 80 will be integrating the charge from the quantum of light L1 105 impinging on the phototransistor Q1 60a. That is the row activation circuit $V_{rowa}$ will be brought to a low level 75 to reverse bias the base emitter junction of the phototransistor Q1 60a and allow the charges to collect at the capacitor C 65a. At this same time another row of pixels—pixel X 85 will be read to sense the level of charge present on the capacitor C 65b.

If the quantum of light impinging L1 105 on the pixel A 80 is sufficiently large, the charges will begin to forward bias the base-emitter junction of the transistor Q1 60a. This will cause an overflow current $I_{ofc}$ 95 to flow in the column interconnection 90. The sense amplifier will now sense the total current $I_{tot}$ 110 which is the sum of the overflow current $I_{ofc}$ 95 and the intended signal current $I_{sc}$ 100. The pixel being read (pixel X 85) will to be brighter than is should be. This will cause a blooming of bright light sources within an image.

Refer now to FIG. 3 to understand the problem of image lag. In this diagram the pixel X—last frame 200 will have been read at the frame time previous to the current frame time. As the row activation circuit $V_{rowx}$ is brought from a high voltage to a low voltage 185, the p-base is reversed biased with respect to the emitter by the coupling of the capacitor C 165. The p-base potential may not be the same for all pixels with the row at the beginning of the image integration time. The amount of P-base potential drop after $V_{row}$ transitions from a high level to a low level (i.e. pulse height) at the beginning of a read operation is:

$\Delta V_B$=(pulse height)×(coupling ratio).

The coupling ratio of the capacitor C 165 is defined as:

$$\gamma = \frac{C}{C + C_{BE} + C_{BC}}$$

where:

$C_{BE}$ is the base-emitter junction capacitance of the transistor Q1 160.

$C_{BC}$ is the base-collector junction capacitance of the transistor Q1 160.

The P-base potential is controlled by the voltage $V_{row}$ and the coupling ratio ($\gamma$). Thus the charge removal from the capacitor C 165 is not complete and will cause a component of a residue current 210 in the emitter of the transistor Q1 160.

A second component of the residue current 210 will be a remnant of minority carrier charges left in the p-base from the injection of electrons from the forward biased base-emitter junction of the transistor Q1 160 during the previous read operation. The residue charges in the p-base will continuously flow with current gain to the emitter of the transistor Q1 160 and will be added to the signal current 215 of the current read time. This will cause a ghosting of the image following moving objects or a tail following a bright object. The residual charge will eventually disappear some time later by either recombination or the minority carrier current flowing away from the P-base. The time for image-lag is approximately the minority carrier recombination lifetime (i.e. approximately 100 msec.) and can last for several frames.

An impurity could be added to the p-base to act as an "life-time killer" to reduce the recombination time. A difficulty with such "life-time killers" is increased junction leakage current, which degrades the imager sensitivity.

U.S. Pat. No. 5,097,305 (Mead et al.) discloses a photosensor having a phototransistor and a capacitor coupled to the base of the phototransistor. A pass transistor is placed in the emitter of the phototransistor to selectively couple the signal current to the sense amplifier.

U.S. Pat. No. 5,288,988 (Hashimoto et al.) describes a photosensor circuit similar to that described in FIGS. 1a, 1b, and 1c. The cell incorporates a MOS transistor in the photoconversion cell. When the MOS transistor is activated, the above described residue current will be prevented by eliminating the residue charges from the base of the phototransistor.

U.S. Pat. No. 5,576,763 (Ackland et al.) discloses a CMOS single polysilicon active pixel. The CMOS active pixel comprises a photo site located on a substrate for generating and storing charge carriers, the charge carriers being generated from photonic energy incident upon the photo site and semiconductor substrate, a photo gate, a transfer transistor and output and reset electronics. The gate of the transfer transistor and the photo gate are defined in a single layer of polysilicon disposed on the semiconductor substrate. The source of transfer transistor is a doped region of substrate, referred to as a coupling diffusion, which provides the electrical coupling between the photo gate and the transfer transistor. The coupling diffusion allows for the transfer of a signal stored in a photo site under the photo gate to the output electronics for processing. The single polysilicon active pixel may be operated by biasing the transfer transistor to the low operating voltage of the pixel for example, 0 volts. By virtue of the structure of the single polysilicon active pixel, this mode of operation results in the same timing as if the transfer transistor were clocked but neither a clock nor the associated driving circuitry are required. However, there is little or no tendency for image lag as occurs in double polysilicon active pixels when they are operated in a manner which avoids clocking the transfer gate.

U.S. Pat. No. 5,512,950 (Watanabe et al.) discloses a solid state CCD imager device and a method for driving the solid state CCD imager device in which an electronic shutter function is provided. The CCD imager will never have charge overflow in the light receiving portion even when the light with a high intensity. The electronic shutter operation is conducted by sweeping out the charges in the light receiving portion by applying a predetermined voltage to a substrate, and the voltage application period is within a horizontal blanking period.

U.S. Pat. No 5,619,049 (Kim) teaches a charge coupled device type solid state image pickup in which the overflow drain is formed at a high concentration on each photosensitive well. A high concentration impurity layer is formed in the top layer of a PNPN structure to act as a drain against overflow. The structure enables overflow and electronic shutter operation even under low voltage conditions and may be realized on chip.

SUMMARY OF THE INVENTION

An object of this invention is to provide a method of electronic shuttering within an active pixel sensor to limit a quantity of light energy impinging on the active pixel sensor.

Another object of this invention is to provide a method to eliminate image-lag from a active pixel sensor within an array of active pixel sensors.

To accomplish these and other objects this invention describes two methods of electronic shuttering of an active pixel sensor and a method to eliminate image-lag from an active pixel sensor within an array of active pixel sensors. The active pixel sensors are comprised of a photodiode having a cathode connected to a power supply voltage source and an anode. A quantum of light will impinge upon said anode and generate electric charges within said photodiode. The active pixel sensor has a MOS transistor. The drain of the MOS transistor is connected to the anode of said photodiode. The gate of the MOS transistor is connected to a sensor control circuit. The sensor control circuit will selectively activate and deactivate said MOS transistor to allow said electric charges to flow through said MOS transistor. The active pixel sensor finally has a bipolar transistor to amplify said electrical charges to create the electronic signal. The collector of the bipolar transistor is connected to the power supply voltage source. The base of the bipolar transistor is connected to the source of said MOS transistor to receive said electric charges when the MOS transistor is activated. The emitter of the bipolar transistor is connected to external circuitry to transfer said electronic signal to external circuitry. The active pixel sensor has a parasitic MOS transistor. The drain of the parasitic MOS transistor is the anode of the photodiode. The source of the parasitic MOS transistor is the anode of the photodiode of adjacent active pixel sensors of a row active pixel sensors in an array of active pixel sensors. The gate of the parasitic MOS transistor is connected to a reset circuit that will turn on said parasitic MOS transistor to reset the potential of the anode to a reference potential to remove residual charges from the photodiode to prevent image-lag on said active pixel sensor.

The first method of electronic shuttering of the active pixel sensor begins by reading of the active pixel sensor during a first time period. This accomplished by activating said MOS transistor to allow said electric charges to flow to the base of the bipolar transistor and be amplified by said bipolar transistor. The active pixel sensor is then deactivated during a second time period. At the end of the second period of time the active pixel sensor is reset. The resetting is accomplished by activating the reset circuit to provide a reset pulse to the gate of the parasitic MOS transistor to turn on said parasitic MOS transistor to reset the potential of the anode to eliminate accumulated charge from said anode. At a third time period the active pixel sensor is placed in an integrating mode. The integrating of the active pixel sensor is accomplished by deactivating the MOS transistor and the parasitic MOS transistor to accumulate the electric charge within said photodiode. Each of the above steps is repeated for subsequent frame periods to create an image.

A second method of electronic shuttering begins by reading of the active pixel sensor during a first time period. The reading starts by activating the MOS transistor to allow the electric charges to flow to the base of the bipolar transistor and be amplified by the bipolar transistor. The active pixel sensor is the deactivated during a second time period. The active pixel sensor is then placed in a sleep mode during a third time period. The sleep mode is initiated by the activating the reset circuit to place a voltage level at the gate of the parasitic MOS transistor. This will reset the potential of the anode to eliminate any accumulated charge from the anode. At the end of the sleep mode and at a fourth time period the active pixel sensor is integrated by deactivating the MOS transistor and the parasitic MOS transistor to accumulate the electric charge within the photodiode. Each of the above steps is repeated for subsequent frame periods to create an image.

A method to eliminate image-lag begins by activating the MOS transistor at a first time to allow the electric charge to flow from the photodiode to the base of the bipolar transistor. The electric charge will be amplified for reading by external circuitry. The reset circuit and a reset biasing voltage source connected through a control parasitic MOS transistor to the source of the parasitic MOS transistor will be maintained at a first voltage level such that the parasitic MOS transistors are not activated. The active pixel sensor is then placed in a sleep mode at a second time to prevent the accumulation of electrical charges in the anode of the photodiode. The accumulation of the electrical charges is accomplished by activating the reset circuit to place a second voltage level at the gate of the parasitic MOS transistor to activate the parasitic MOS transistor. Then the reset biasing voltage source is placed at a third voltage level sufficient to extract residual minority carriers from the base of the bipolar transistor through said MOS transistor, the anode of said photodiode, and the parasitic MOS transistor to the reset voltage source. The parasitic MOS transistor is then deactivated and the reset biasing voltage source is returned to a reference voltage level to place the anode of the photodiode at the reference voltage level at a third time. The MOS transistor is then deactivated at a fourth time to allow the anode to begin integrating the electrical charges within the anode of the photodiode to complete a frame of an image. The above steps are then repeated for subsequent frames of an image.

BRIEF DESCRIPTION OF THE DRAWINGS

FIGS. 1a and 1b are a top view and a cross sectional view of a semiconductor substrate showing a photosensor cell of the prior art.

FIG. 1c is a schematic diagram of the photosensor cell of the prior art shown in FIGS. 1a and 1b.

FIG. 1d is a timing diagram of the photosensor cell of the prior art shown in FIGS. 1a and 1b.

FIG. 2 is a schematic drawing of two cells of an array of photosensor cells of the prior art illustrating the overflow currents that cause image blooming.

FIG. 3 is a schematic drawing of a cell of an array of photosensor cells of the prior art illustrating the residue current that causes image lag.

DETAILED DESCRIPTION OF THE INVENTION

Figure 4A:
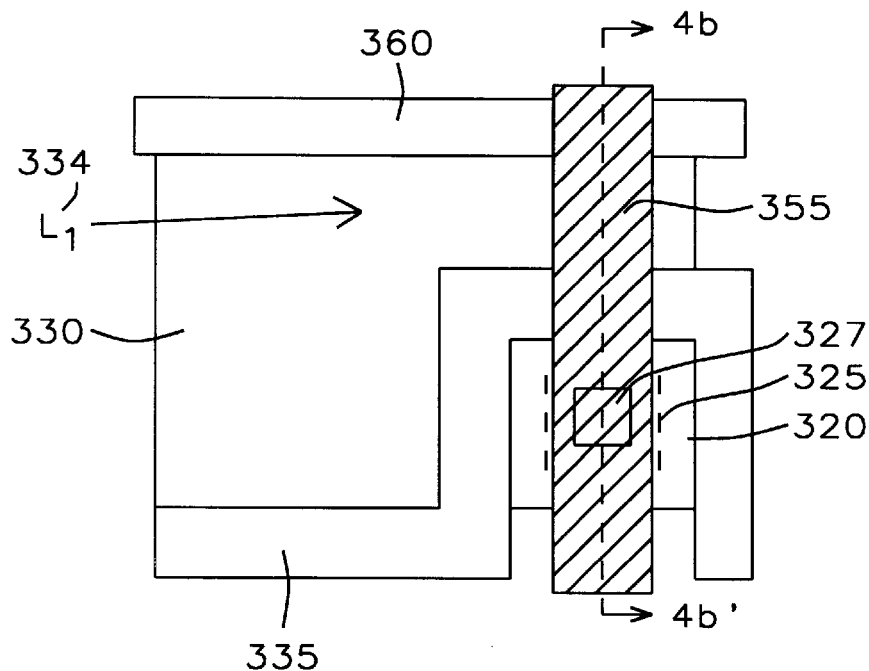
FIGS. 4a and 4b are a top view and a cross sectional view of a semiconductor substrate showing an active pixel sensor shown in FIGS. 4a and 4b.
Figure 4B:
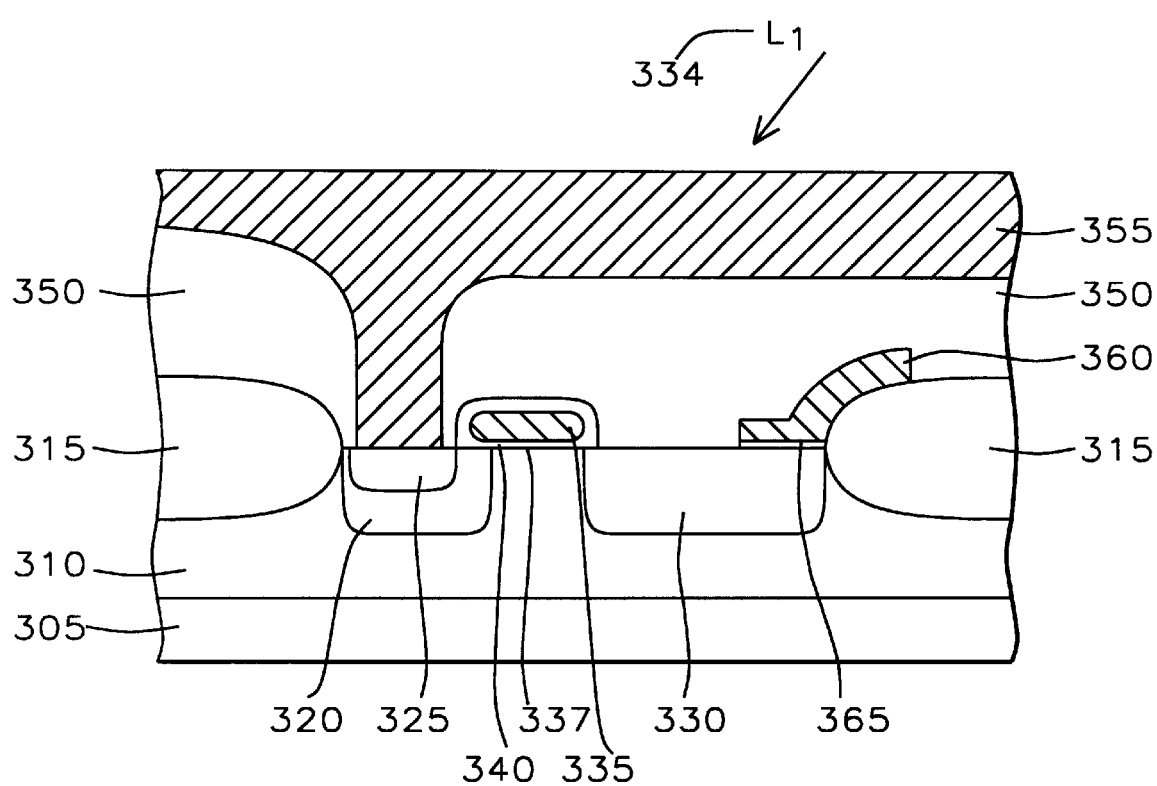
Figure 4C:
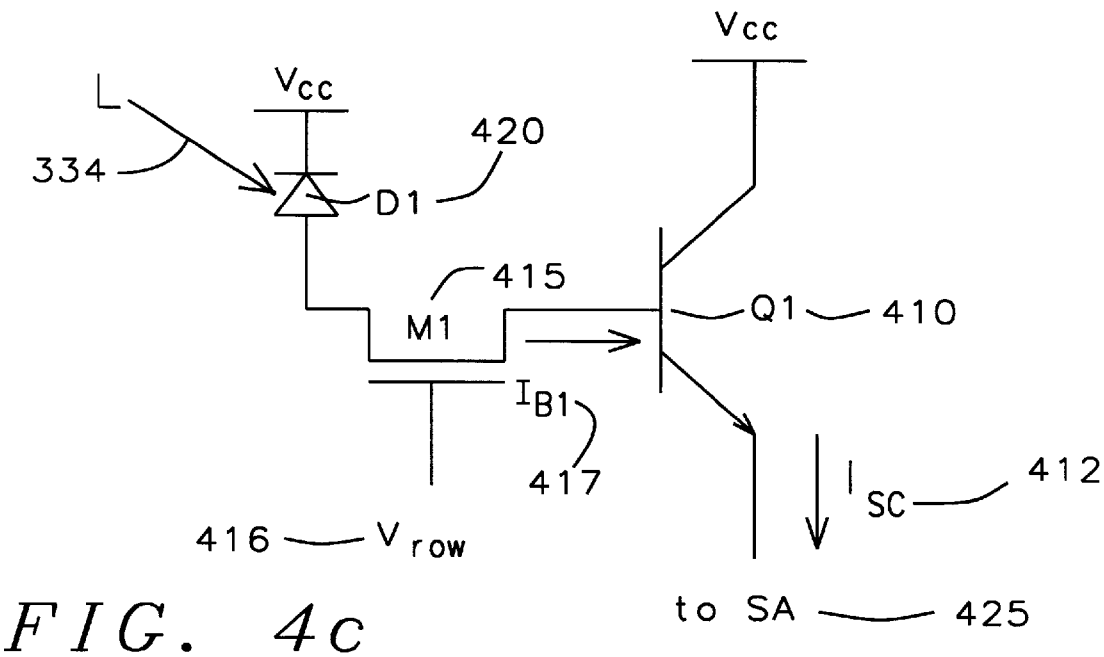
FIG. 4c is a schematic diagram of an active pixel sensor cell shown in FIGS. 4a and 4b.

Refer now to FIGS. 4a, 4b, and 4c to understand the structure of the active pixel sensor of this invention. The fabrication of the device starts from a typical P-type substrate 305 of a silicon wafer. The surface of the P-substrate 305 will then be masked and an N-type impurity will be implanted to form the N-well 310. An isolation region or field oxide 315 is grown to delineate the area of the active pixel cell. Within the area of the active pixel sensor cell is masked to define the P-anode 330 of the photodiode D1 420. A P-type impurity is implanted to form the P-anode 330. The N-well will be placed in contact with a power supply voltage source $V_{cc}$ and function as the cathode of the photodiode D1 420.

A second area within the area of the active pixel sensor cell will be masked to delineate the P-base 320 of the bipolar transistor Q1 410. A P-type impurity will be implanted to form the P-base 320. A third area within the P-base 320 is then masked and implanted with an N-type impurity to form the emitter 325 of the bipolar transistor Q1 420. The collector of the bipolar transistor Q1 420 will be the N-well 310.

The P-base 320 of the bipolar transistor Q1 410 and the P-anode 330 of the photodiode D1 420 respectively form the drain and source of the MOS transistor M1 415. A gate oxide 340 will be grown above the channel region 337 between the source 320 and the drain 330. On the gate oxide 340 a polysilicon material 335 will be deposited and etched to form a gate for the MOS transistor M1 415.

An insulating material will be deposited on the surface of the semiconductor substrate to form the dielectric 350. A contact 327 to the $N^+$ emitter 325 is formed in an opening in the dielectric 350. A metal layer 355 is deposited to connect the emitter 325 of transistor M1 415 to a sense amplifier 425 that is in circuitry external to the array of active pixel sensors. The polysilicon material 335 that forms the gate of the MOS transistor M1 415 will be the connection to the row activation circuit $V_{row}$ 416 that is a function of the sensor control circuitry. It will be again be apparent, that the above described process flow can be used to form CMOS transistors. For instance the polysilicon material 335 can be used to form a gate of the CMOS transistor and the n-type implant that is used to form the emitter 325 can be used to form a source/drain region. The compatibility of fabricating bipolar pixels and CMOS transistors is a great advantage compared to the process used in CCD fabrication methods.

Figure 4D:
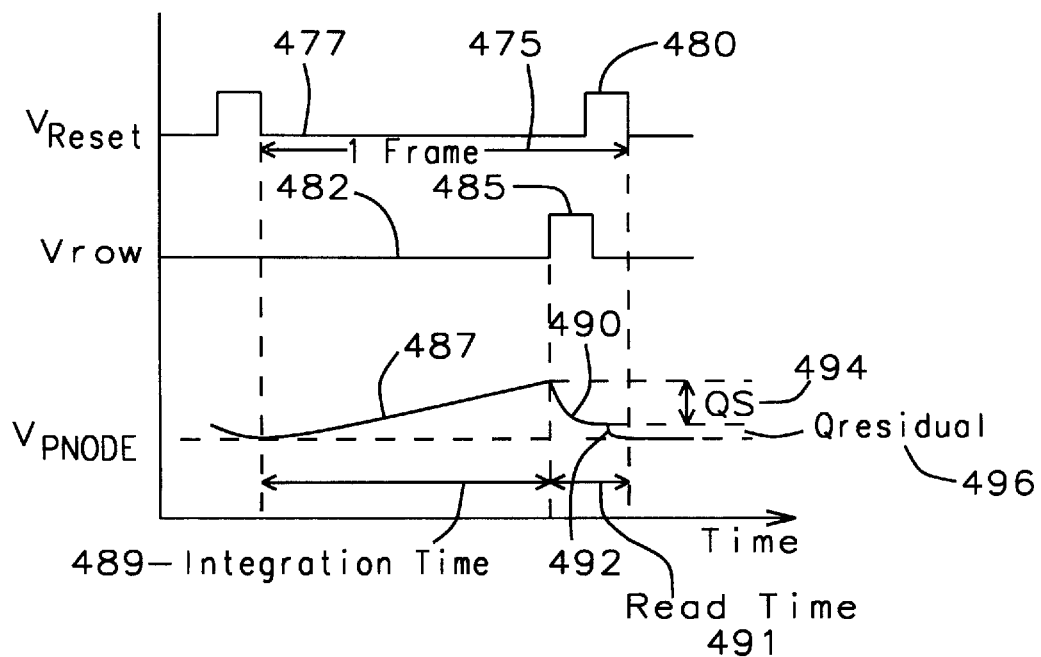
FIG. 4d is a timing diagram of an active pixel sensor.

Refer now additionally to FIG. 4d to understand the operation of the active pixel sensor cell. A quantum of light L 334 will impinge upon the P-anode 330 of the diode D1 420. The quantum of light L 334 will impart sufficient energy as to create electron-hole pairs similar to that above described for the phototransistor Q1 60 of the FIGS. 1a, 1b, and 1c. The holes will migrate to the side of the P-anode 330 of the photodiode D1 420. The electrons will be collected at the cathode (the N-well 310) of the photodiode D1 420 and removed through the power supply voltage source $V_{cc}$. This positive charge accumulation of holes in the P-anode 330 of the photodiode D1 420 is shown as the increase in potential 487. The row activation circuit $V_{row}$ 416 will be brought from a high voltage level to a low voltage level thus turning on the P MOS transistor M1 415. The charge $Q_s$ 494 generated from the quantum of light L 334 (the image) as represented by the P-anode potential $V_{P-anode}$ will flow into the P-base 320 of the transistor Q1 410 forming the base current $I_{B1}$ 417. The base current $I_{B1}$ 417 will be amplified by the transistor Q1 410 and form the signal current $I_{sc}$ 412. After sensing the signal current, the row activation circuit $V_{row}$ 416 has its voltage returned to the low voltage level 485, there will be a residual charge $Q_{residual}$ 496 remaining in the P-base 320 of the photodiode D1 420. The P-anode 330 of the photodiode D1 420 is then reset to a voltage level by the operation of reset as described hereinafter.

Figure 5:
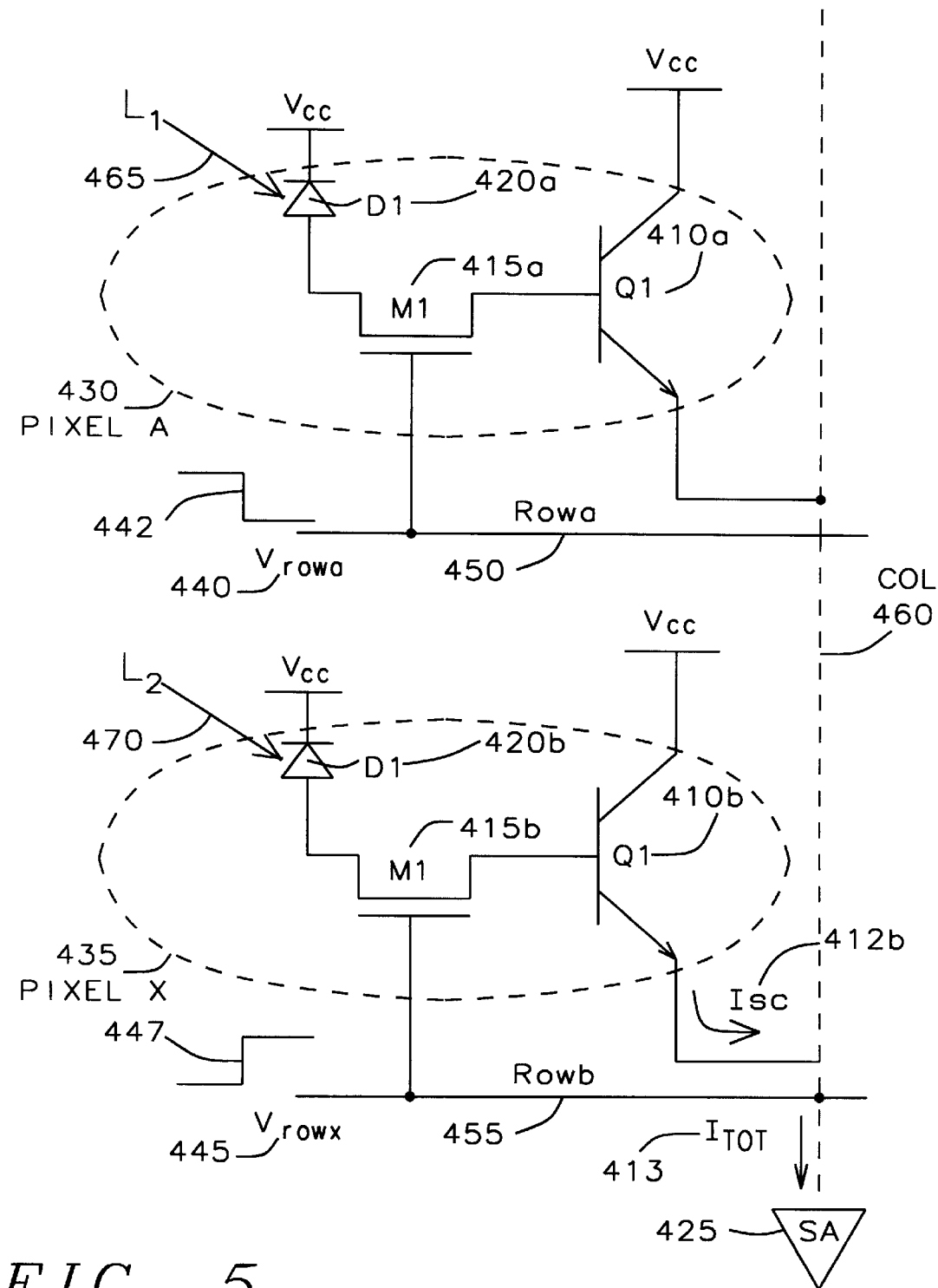
FIG. 5 is a schematic diagram of two cells of an array of active pixel sensor cells illustrating the elimination of overflow currents.

Refer first to FIG. 5 to understand the operation of the active pixel sensor of this invention to prevent blooming of the pixel image. Pixel A 430 and Pixel X 435 are two active pixel sensors of an array of active pixels sensors that are arranged in rows and columns. Pixel A 430 and Pixel X 435 will be connected commonly to the column 460 and to the common sense amplifier 426.

The control of the activation of Pixel A 430 will be by row activation circuit $V_{rowa}$ 450 through the interconnection Row a 450 and the control of the activation of Pixel X 435 will be by row activation circuit $V_{rowx}$ 445 through the interconnection Row x 455. When the row activation circuit $V_{rowa}$ 450 is brought to a high value 442, the pixel A 430 will be in the integration time 489. At this time if the charge accumulated by the quantum of light L2 470 by the photodiode D1 420b of the pixel X 435 is to be read, the row activation circuit $V_{rowx}$ 445 will be brought to a low voltage level 447 to turn on the P-MOS transistor M1 415b. The signal current $I_{sc}$ 412b will flow from the emitter of the transistor Q1 410b of the pixel X 435.

Even if the quantum of light L1 465 impinging on the photodiode D1 420a is excessively strong, there will be no overflow current $I_{ofc}$ 95 of FIG. 2. The P-MOS transistor M1 415a will be deactivated and no current can flow to the transistor Q1 410a. Under excessively strong light L1 465, holes accumulated at the P-anode raise the potential of the P-anode rapidly until the photodiode is slightly forward biased and an "overflow current" is flowing into the power supply voltage source $V_{cc}$ of the cathode of the photodiode. Thus the total current $I_{tot}$ 413 will have not extraneous component and consist only of the signal current $I_{sc}$ 412b. This will prevent blooming of the image since the sense amplifier 425 will receive only the appropriate magnitude of current.

The understand the reset operation refer back to FIGS. 4a, 4b, 4c, and 4d. A second polysilicon material 360 is deposited over a layer of insulating material 365 that is formed when the gate oxide 340 is grown. This reset polysilicon 360 will be connected to a reset circuit $V_{reset}$. The reset circuit $V_{reset}$ will apply a low voltage level 480 to the reset polysilicon 360 so that parasitic P-MOS transistors formed by adjacent active pixel sensors will be on and the potential of all the P-anode 330 will be reset to the same level. Details of the parasitic P-MOS transistor and reset operation are described next in FIGS. 6a, 6b, and 6c.

Figure 6A:
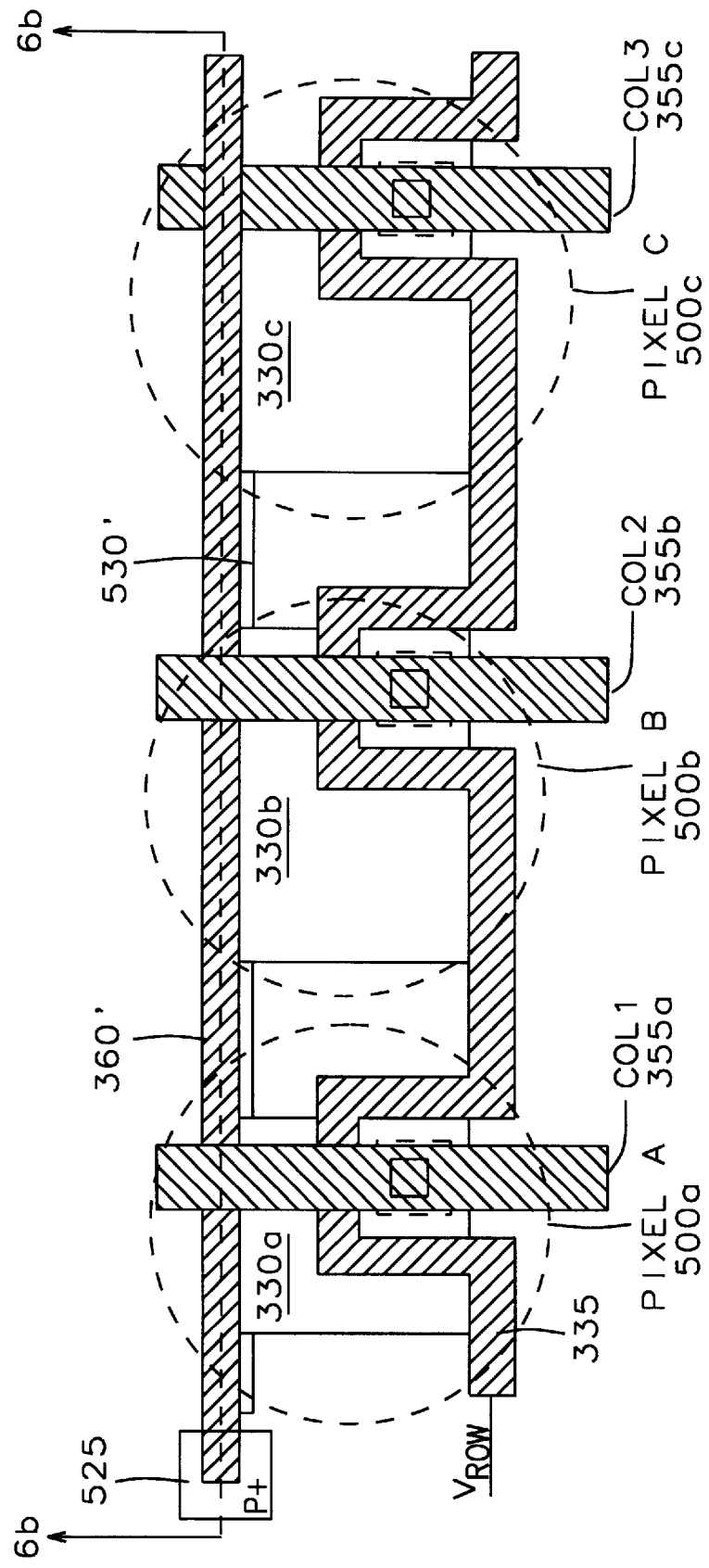
FIGS. 6a, 6b, and 6c show a top view, a cross sectional view, and a schematic diagram of three cells of an array of active pixel sensor cells illustrating the photodiode reset operation to minimize image lag.
Figure 6B:
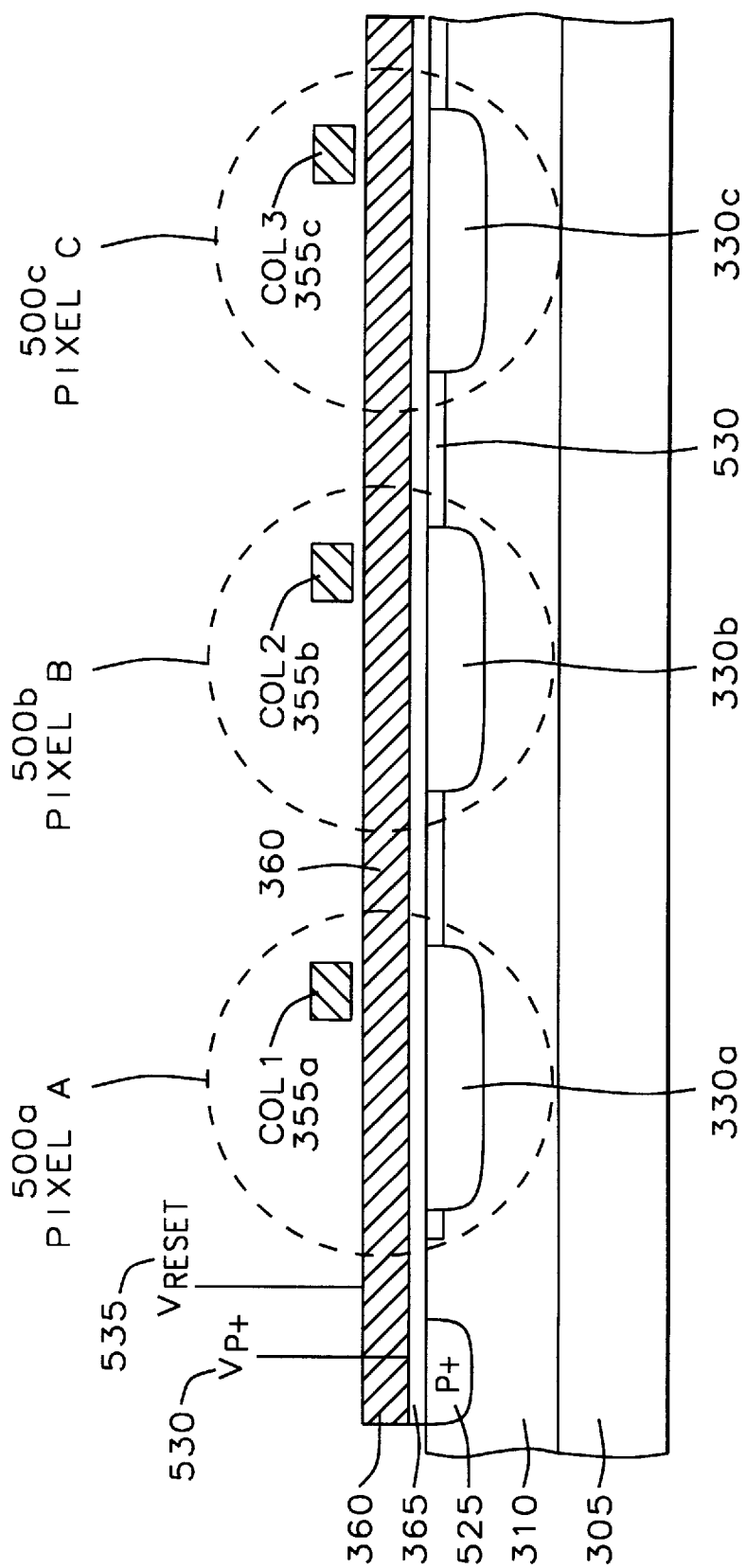
Figure 6C:
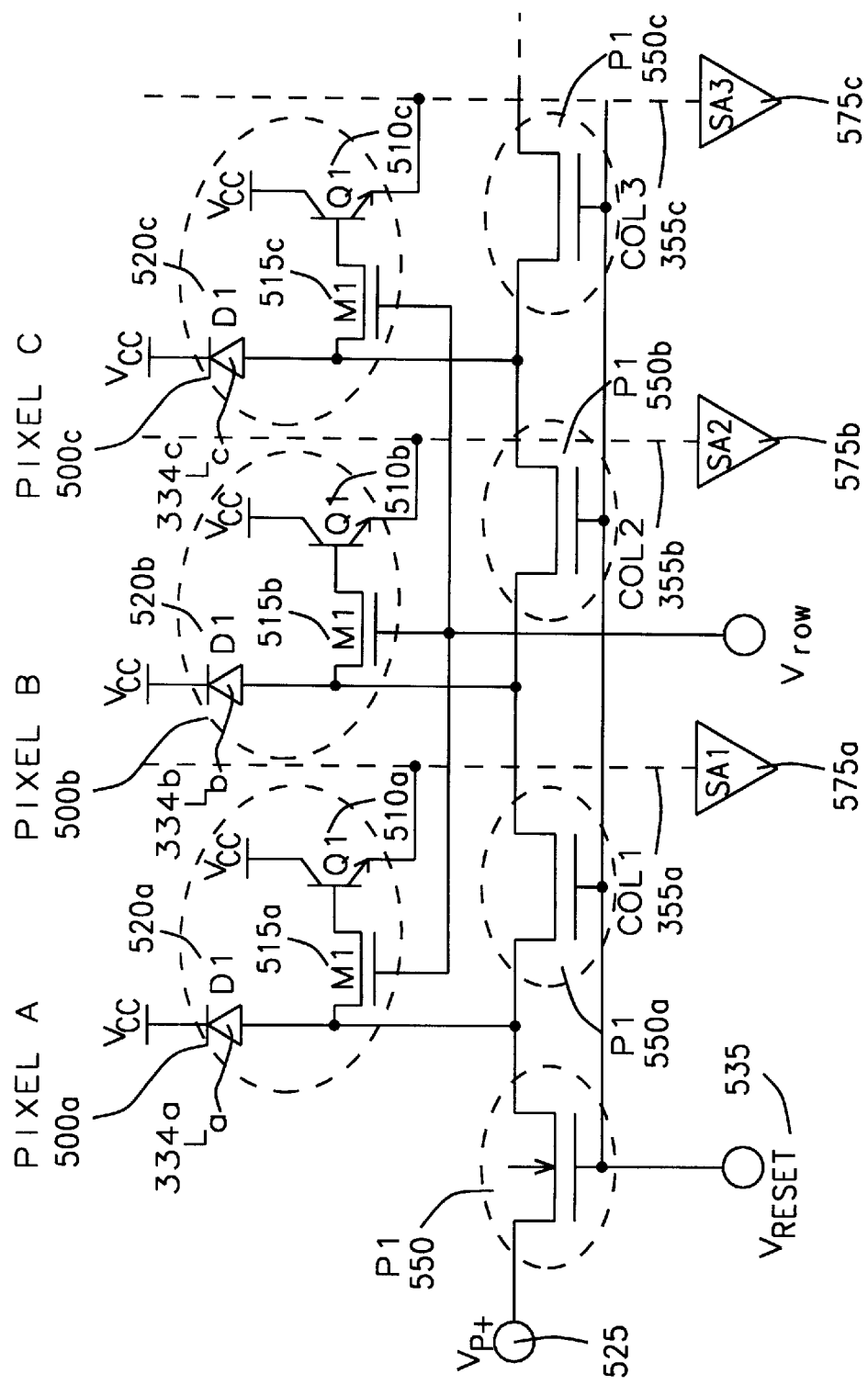

FIGS. 6a, 6b, and 6c show three active pixel sensors 500a, 500b, 500c on a row within an array of rows and columns of active pixel sensors. The gates 505a, 505b, 505c, of the P-MOS transistors M1 515a, 515b, 515c of each of the active pixel sensors 500a, 500b, 500c are connected by the common row polysilicon material 335 to the row activation circuit $V_{row}$. The reset polysilicon 360 is interconnected with all the reset 360 polysilicon layers of each active pixel sensor 500a, 500b, and 500c and to the reset control circuit $V_{reset}$ 535. An edge junction 520 is formed by the implantation of a P-type material into the surface of the semiconductor substrate 305 at the end of a row of active pixel sensors 500a, 500b, and 500c. The edge junction will be connected to a reset biasing voltage source $V_{p+}$ 330. The oxide 365 formed when the gate oxide is grown, will isolate the reset polysilicon layer 360 from the P-anodes 330a, 330b, 330c.

Each of the P-anodes 330a, 330b, 330c will form the drain/source for the parasitic P-MOS transistors P1 550a, 550b, and 550c, of each active pixel sensor 500a, 500b, 500c. When the reset circuit $V_{reset}$ 530 is biased to a low voltage level, each of the parasitic P-MOS transistors P1 550a, 550b, and 550c of each active pixel sensor 500a, 500b, 500c will be turned on and all the potentials of the P-anodes 330a, 330b, 330c will be reset to be the same as the edge junction 525 to the reset biasing voltage source $V_{p+}$ 530.

A $V_T$ implant 535 is optionally placed in the channel area of the parasitic MOS transistor P1 550 to define the threshold voltages $V_T$ of the parasitic MOS transistor P1 550 to desirable values. The implant will either be a N-type impurity or P-type impurity dependent on whether the parasitic MOS transistor P1 550 is to operate as an enhancement or a depletion MOS transistor.

The activation of the parasitic MOS transistor P1 550 will partially eliminate the image-lag by resetting the potential of all P-anodes in a row to the same potential as the edge junction biased at the voltage source $V_{p+}$ 530 as described in the prior art.

Refer back to FIGS. 4c and 4d. During the read operation, the image charge $Q_s$ 494 will flow into the P-base as a base current and forward bias the P-base of the bipolar transistor Q1 410 and initiate bipolar action. The base current from the image charge $Q_s$ 494 will be amplified as described above to form the emitter current $I_{sc}$ 412, which will flow into the sense amplifier 425. The total charge collected by the sense amplifier 425 which is the amplified image charge $Q_s$ 494 will represent the amplitude of light L1 334 to impinge on the photodiode D1 420.

The area of the anode of the photodiode D1 420 is designed to be much larger than the base of bipolar transistor Q1 410. This will force the base of bipolar transistor Q1 410 to have a voltage that is the same as that of the anode of the photodiode D1 420. The injected minority carriers (electrons injected from the emitter) is confined to the base of the bipolar transistor Q1 410 and can not flow through the inverted P-channel MOS transistor and reach the anode of the photodiode D1 410. There will be little unrecombined charges left in the base of the bipolar transistors Q1 410. This combined with the above described reset operation will reduce the image-lag to a negligible level.

Figure 7:
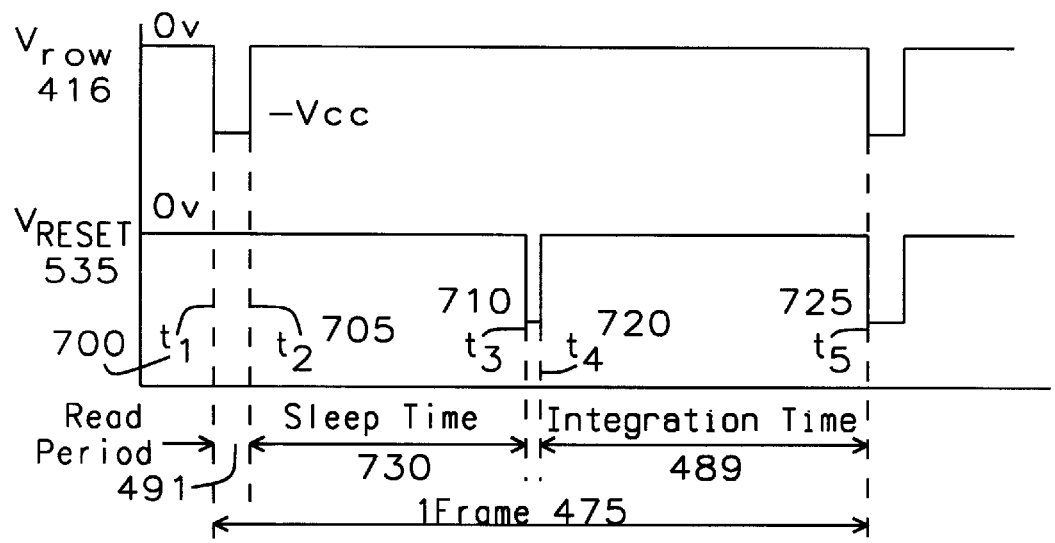
FIG. 7 is a timing diagram of the first embodiment of the method of this invention to provide an electronic shuttering for an active pixel sensor.

Electronic shuttering of the active pixel sensor requires that the amount of charge accumulated during the integration time 489 of FIG. 4d be controlled. The Frame Time 475 and the read time 491 of FIG. 4d must not be adjusted to insure the scanning of an array of active pixel sensors is synchronized. Refer now to FIG. 7 as well as FIGS. 4c, 4d and 6c to discuss the first embodiment of the method for electronic shuttering of the active pixel sensor.

During the read period 491 the row activation circuit $V_{row}$ 416 will be brought to the low voltage level to turn on the P-MOS transistor M1 415. The electrical charge accumulated in the anode of the photodiode D1 420 will flow to the base of the bipolar transistor Q1 410 to be amplified and read by the external circuitry as above described. The low voltage level will be approximately the voltage level of the negative of the power supply voltage source $-V_{cc}$. The read time will be from the time $t_1$ 700 to the time $t_2$ 705.

At the time $t_2$ 705 the row activation circuit $V_{row}$ 416 will be brought to the high voltage level (approximately 0V) to turn off the P-MOS transistor M1 415. The active pixel sensor will be placed in a sleep mode for the period between time $t_2$ 705 and time $t_3$ 710.

At the time $t_3$ 710 the reset control circuit $V_{reset}$ 535 will pulse the gate of the parasitic P-MOS transistors P1 550a, 550b, and 550c to a low voltage level to turn on the parasitic P-MOS P1 550a, 550b, and 550c. Any charges accumulated at the anode of the photodiode D1 520a, 520b, and 520c will be transferred to the reset biasing voltage source $V_{p+}$ 530 thus resetting the anode of the photodiode D1 520a, 520b, and 520c. The voltage of the reset biasing voltage source $V_{p+}$ 530 will be approximately 0V.

The reset width of the pulse between the time $t_3$ 710 and the time $t_4$ 720 will be approximately 100 ns to approximately 1 $\mu s$ and is sufficiently long to eliminate the charges accumulated at the anodes of the diodes D1 520a, 520b, and 520c. After the reset control circuit has returned to the high level (approximately 0V) at time $t_4$ 720, the integration time will start. The integration time is between the time $t_4$ 720 and time $t_5$ 725 at the beginning of the read period of a following frame.

To control the integration time 489, and thus perform the electronic shuttering, the placement of the pulsing of the reset control circuit $V_{reset}$ 535 at time $t_3$ 710 during the frame period 475 must be adjusted. Under a fixed frame period 475, decreasing the sleep time 730 results in increasing the integration time 489, that is the electronic shutter will open for a longer exposure period. Conversely, increasing the sleep time $t_3$ 730 would result in decreasing the integration time 489, that is the electronic shutter would open for a shorter exposure period.

Figure 8:
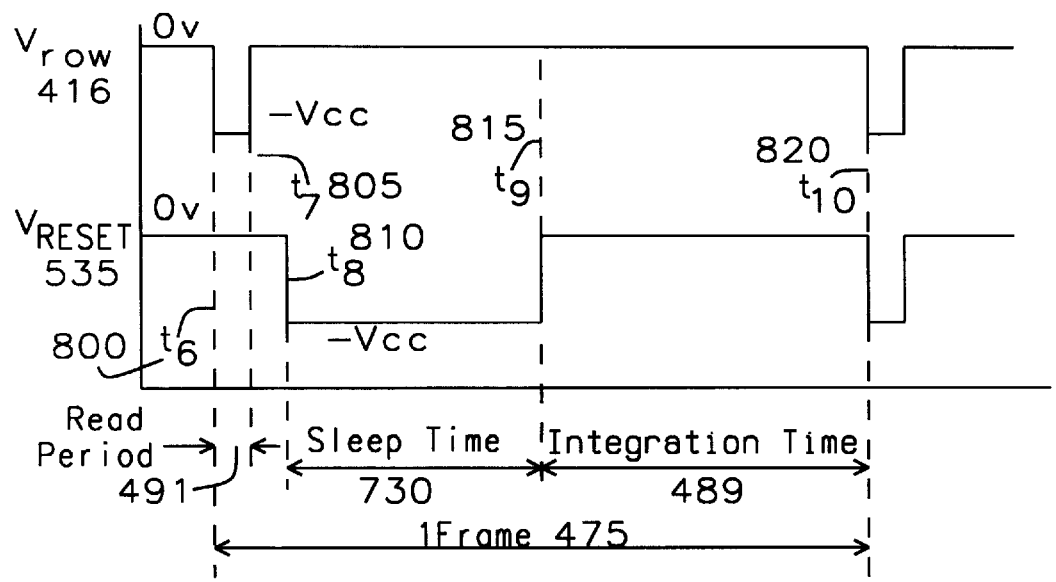
FIG. 8 is a timing diagram of the second embodiment of the method of this invention to provide an electronic shuttering for an active pixel.

Refer now to FIG. 8, as well as FIGS. 4c, 4d and 6c, for a second embodiment of a method of electronic shuttering of the active pixel sensor. The read period 491 is as above described, with the row activation circuit 416 being brought to the low level for the time period from time $t_6$ 800 to time $t_7$ 805 to activate the P-MOS transistor $M_1$ 415. The charge accumulated during the previous frame flows to the base of the bipolar transistor Q1 415 as described above.

At the time $t_8$ 810 the reset control circuit $V_{reset}$ 535 will bring the voltage level at the gate of the parasitic P-MOS transistor P1 550a, 550b, and 550c to a low level that is the negative of the power supply voltage source $-V_{cc}$. The parasitic P-MOS transistor P1 550a, 550b, and 550c will turn on preventing any accumulation of electrical charge generated by the quantum of light L 334a, 334b, and 334c that will impinge upon the active pixel sensors 500a, 500b, and 500c.

At the time $t_9$ 815 the reset control circuit will bring the voltage level at the gates of the parasitic P-MOS transistors P1 550a, 550b, and 550c to the high level (approximately 0V). The anode of the diodes D1 520a, 520b, and 520c will start accumulating the electrical charge generated by the conversion of the quantum of light L 334a, 334b, and 334c. At the time $t_{10}$ 820 the integration time will end and the read time of the following frame will begin.

The placement of the time $t_9$ 815 relative to the time $t_8$ 810 and the time $t_{10}$ 820 will determine the amount of electronic shuttering. If the sleep time 830 is decreased by moving time $t_9$ 815 closer to the time $t_8$ 810, the integration time 489 will increase, thus increasing the time period of opening the electronic shutter. Conversely, increasing the sleep time 830 by moving the time $t_9$ 815 closer to the time $t_{10}$ 820 will decrease the integration time 489, thus decreasing the time period for opening the electronic shutter. The time period for a frame 475 will not be changed.

Figure 9:
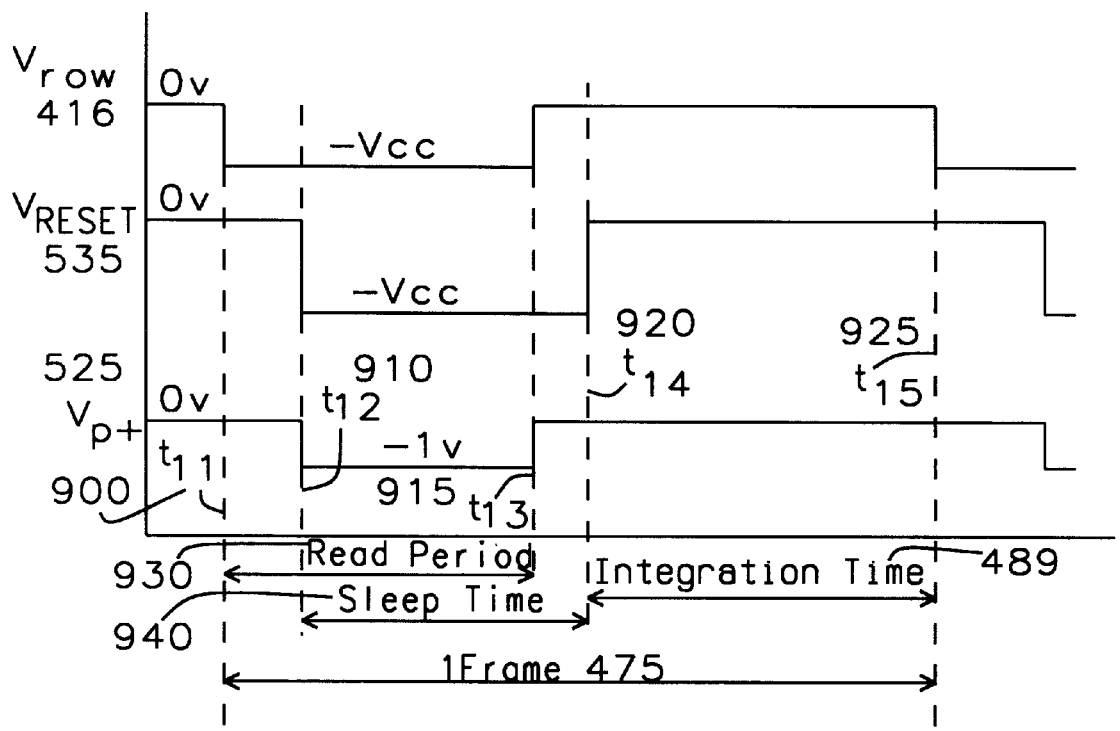
FIG. 9 is a timing diagram of the method of this invention to eliminate image-lag for an active pixel sensor.

While the reset operation of the row of active pixel sensors as shown in FIGS. 6a, 6b, and 6c will bring the image-lag to a minimal amount, FIG. 9 shows a method of operation of the active pixel sensor to eliminate image-lag within an array of active pixel sensors. The image-lag can be eliminated by overlapping the read period 930 and the sleep time 940, and bringing the reset biasing voltage source $V_{p+}$ 525 to a lower level to extract all the minority carriers from the base of the bipolar transistor Q1 410 of FIG. 4c.

Referring additionally to FIGS. 4c and 6c, the method of operation of the active pixel sensor to eliminate image-lag begins by the row activation circuit $V_{row}$ 416 placing a low level on the gate of the P-MOS transistor M1 415. The P-MOS transistor M1 415 will be turned on and the charge accumulated on the anode of the photodiode D1 420 during the previous integration time will be transferred to the base of the bipolar transistor Q1 410. The electrical charge will be amplified and then read as previously described by the external circuitry.

The reset control circuit $V_{reset}$ 535 will bring the gates of the parasitic P-MOS transistor P1 550a, 550b, and 550c to a low voltage level of approximately the negative of the power supply voltage source $-V_{cc}$ at time $t_{12}$ 910. Additionally the reset biasing voltage source $V_{p+}$ 525 is brought to a voltage level (approximately $-1v$) that will slightly reverse bias the base-emitter junction of the bipolar transistors Q1 510a, 510b, and 510c. The reverse biased base current of the bipolar transistors Q1 510a, 550b, and 510c will extract the minority carriers from the base region of the bipolar transistor Q1 510a, 510b, and 510c. It will be noted that the read operation is performed during the times $t_{11}$ and $t_{12}$.

At the time $t_{13}$ 915, the row activation circuit will place the high level (approximately 0V) on the gate of the P-MOS transistor M1 415 to turn off the P-MOS transistor M1 415. The reset biasing voltage source $V_{p+}$ 525 will be restored to the original reference voltage level (approximately 0V) at time $t_{13}$ 915. This will restore the anodes of the photodiodes D1 520a, 520b, and 520c to the original reference voltage level (approximately 0V).

At the time $t_{14}$ 920, the reset control circuit $V_{reset}$ 535 will be brought to the high voltage level (approximately 0V), thus turning off the parasitic P-MOS transistors P1 550a, 550b, and 550c. The anode of the photodiodes D1 520a, 520b, and 520c will begin to accumulate the electrical charges during the integration time 489. The time period from time $t_{13}$ 915 and $t_{14}$ 920 will be from approximately 1 ns to 10 ns but is not a critical parameter to the operation. At the time $t_{15}$ 925, the frame 475 will be complete and the read period of the following frame will sense the electrical charges accumulated during the integration period 489.

The length of the sleep time 940 will ensure the extraction of the minority carriers from the base of the bipolar transistors Q1 510a, 510b, and 510c.

While this invention has been particularly shown and described with reference to the preferred embodiments thereof, it will be understood by those skilled in the art that various changes in form and details may be made without departing from the spirit and scope of the invention. Reversing the polarities of the silicon materials implanted can easily form a corresponding pixel with a PNP bipolar transistor and an N-MOS transistor. The operation biases and the signal levels shown in FIGS. 7, 8, and 9 will also be reversed appropriately.

The invention claimed is:

1. A method of electronic shuttering an active pixel sensor to limit an amount of light sensed by said active pixel sensor, whereby the active pixel sensor comprises:

a photodiode having a cathode connected to a power supply voltage source and an anode, whereby a quantum of light will impinge upon said anode and generate electric charges within said photodiode, a MOS transistor having a drain connected to the anode of said photodiode, a source, and a gate connected to a sensor control circuit, whereby said sensor control circuit will selectively activate and deactivate said MOS transistor to allow said electric charges to flow through said MOS transistor, a bipolar transistor to amplify said electrical charges to create the electronic signal, having a collector connected to the power supply voltage source, a base connected to the source of said MOS transistor to receive said electric charges when the MOS transistor is activated, and emitter connected to external circuitry to transfer said electronic signal to external circuitry, and a parasitic MOS transistor having a drain that is the anode of the photodiode, a source that is the anode of the photodiode of adjacent active pixel sensors of a row active pixel sensors in an array of active pixel sensors, and a gate connected to a reset circuit that will turn on said parasitic MOS transistor to reset a potential of the anode of the photodiode to prevent image-lag on said active pixel sensor, comprising the steps of:

a) reading of the active pixel sensor during a first time period by activating said MOS transistor to allow said electric charges to flow to the base of the bipolar transistor and be amplified by said bipolar transistor;

b) deactivating the active pixel sensor during a second time period;

c) resetting of the active pixel sensor at an end of the second time period activating the reset circuit to provide a reset pulse to the gate of the parasitic MOS transistor to turn on said parasitic MOS transistor to reset the potential of the anode to eliminate accumulated charge from said anode;

d) integrating of the active pixel sensor during a third time period by deactivating the MOS transistor and the parasitic MOS transistor to accumulate the electric charge within said photodiode;

e) adjusting the second time period relative to the third time period while maintaining a constant frame period to control the quantity of light sensed by said active pixel sensor; and f) repeating the above described steps for subsequent frame periods to create an image.

2. The method of claim 1 wherein the reset pulse is from approximately 100 ns to approximately 1 µs in duration.

3. A method of electronic shuttering an active pixel sensor to limit an amount of light sensed by said active pixel sensor, whereby the active pixel sensor comprises:

a photodiode having a cathode connected to a power supply voltage source and an anode, whereby a quantum of light will impinge upon said anode and generate electric charges within said photodiode, a MOS transistor having a drain connected to the anode of said photodiode, a source, and a gate connected to a sensor control circuit, whereby said sensor control circuit will selectively activate and deactivate said MOS transistor to allow said electric charges to flow through said MOS transistor, a bipolar transistor to amplify said electrical charges to create the electronic signal, having a collector connected to the power supply voltage source, a base connected to the source of said MOS transistor to receive said electric charges when the MOS transistor is activated, and emitter connected to external circuitry to transfer said electronic signal to external circuitry, and a parasitic MOS transistor having a drain that is the anode of the photodiode, a source that is the anode of the photodiode of adjacent active pixel sensors of a row active pixel sensors in an array of active pixel sensors, and a gate connected to a reset circuit that will turn on said parasitic MOS transistor to reset a potential of the anode of the photodiode to prevent image-lag on said active pixel sensor, comprising the steps of:

a) reading of the active pixel sensor during a first time period by activating said MOS transistor to allow said electric charges to flow to the base of the bipolar transistor and be amplified by said bipolar transistor;

b) deactivating the active pixel sensor during a second time period;

c) placing the active pixel sensor in a sleep mode during a third time period by the activating the reset circuit to place a voltage level at the gate of the parasitic MOS transistor to reset the potential of the anode to eliminate any accumulated charge from said anode d) integrating of the active pixel sensor during a fourth time period by deactivating the MOS transistor and the parasitic MOS transistor to accumulate the electric charge within said photodiode; and e) adjusting the third time period relative to the fourth time period while maintaining a constant frame period to control the quantity of light sensed by said active pixel sensor; and f) repeating the above described steps for subsequent frame periods to create an image.

4. A method to eliminate image-lag in an active pixel with an array of active pixel sensors, whereby the active pixel sensor comprises:

a photodiode having a cathode connected to a power supply voltage source and an anode, whereby a quantum of light will impinge upon said anode and generate electric charges within said photodiode, a MOS transistor having a drain connected to the anode of said photodiode, a source, and a gate connected to a sensor control circuit, whereby said sensor control circuit will selectively activate and deactivate said MOS transistor to allow said electric charges to flow through said MOS transistor, a bipolar transistor to amplify said electrical charges to create the electronic signal, having a collector connected to the power supply voltage source, a base connected to the source of said MOS transistor to receive said electric charges when the MOS transistor is activated, and emitter connected to external circuitry to transfer said electronic signal to external circuitry, and a parasitic MOS transistor having a drain that is the anode of the photodiode, a source that is the anode of the photodiode of adjacent active pixel sensors of a row active pixel sensors in an array of active pixel sensors, and a gate connected to a reset circuit that will turn on said parasitic MOS transistor to reset a potential of the anode of the photodiode to prevent image-lag on said active pixel sensor, comprising the steps of:

a) activating the MOS transistor at a first time to allow the electric charge to flow from said photodiode to the base of the bipolar transistor to be amplified for reading by external circuitry, b) maintaining the reset circuit and a reset biasing voltage source connected through a control parasitic MOS transistor to the source of the parasitic MOS transistor, at a first voltage level such that the parasitic MOS transistors are not activated, c) placing the active pixel sensor in a sleep mode at a second time to prevent the accumulation of electrical charges in the anode of the photodiode by the activating the reset circuit to place a second voltage level at the gate of the parasitic MOS transistor to activate the parasitic MOS transistor, d) placing the reset biasing voltage source at a third voltage level sufficient to extract residual minority carriers from the base of the bipolar transistor through said MOS transistor, said anode of said photodiode, and said parasitic MOS transistor to the reset voltage source;

e) deactivating the parasitic MOS transistor and returning the reset biasing voltage source to a reference voltage level to place the anode of the photodiode at the reference voltage level at a third time;

f) deactivating the MOS transistor at a fourth time to allow the anode to begin integrating the electrical charges within the anode of the photodiode to complete a frame of an image; and g) repeating the above steps for subsequent frames of an image.

5. The method of claim 4 wherein the MOS transistor is activated by placing a fourth voltage level that is the negative of the power supply voltage source on the gate of the MOS transistor.

6. The method of claim 4 wherein the third voltage level will reverse bias a junction between the base and emitter of the bipolar transistor and allow extraction of the residual minority carriers.

7. The method of claim 4 wherein the second voltage level is the negative of the power supply voltage source.

8. The method of claim 4 wherein the reference voltage level is 0V.

* * * * *